US007558060B2

(12) United States Patent
Kiyosumi

(10) Patent No.: US 7,558,060 B2
(45) Date of Patent: Jul. 7, 2009

(54) COOLING DEVICE FOR IMAGE FORMING APPARATUS

(75) Inventor: Tadahiro Kiyosumi, Nara (JP)

(73) Assignee: Kyocera Mita Corporation, Osaka (JP)

( * ) Notice: Subject to any disclaimer, the term of this patent is extended or adjusted under 35 U.S.C. 154(b) by 1 day.

(21) Appl. No.: 11/289,164

(22) Filed: Nov. 29, 2005

(65) Prior Publication Data

US 2006/0114654 A1 Jun. 1, 2006

(30) Foreign Application Priority Data

Nov. 30, 2004 (JP) ............................ 2004-346657

(51) Int. Cl.
*H05K 7/20* (2006.01)

(52) U.S. Cl. .................. 361/695; 361/679.49; 361/690; 361/692; 361/694; 399/33; 399/92; 165/80.3

(58) Field of Classification Search ................. 361/679, 361/688, 687, 690, 695, 796, 692, 694; 399/6, 399/33, 90, 92, 107, 111, 55, 94, 99; 355/30; 353/52, 57, 61; 257/712; 165/34, 104, 121, 165/908, 104.34; 454/184
See application file for complete search history.

(56) References Cited

U.S. PATENT DOCUMENTS

| | | | | |
|---|---|---|---|---|
| 5,136,329 | A * | 8/1992 | Sugiura | 355/30 |
| 5,414,492 | A * | 5/1995 | Kubota | 399/111 |
| 5,561,496 | A * | 10/1996 | Sugiura et al. | 399/107 |
| 5,694,294 | A * | 12/1997 | Ohashi et al. | 361/687 |
| 5,754,398 | A * | 5/1998 | Glovatsky et al. | 361/690 |
| 5,887,226 | A * | 3/1999 | Taki | 399/92 |
| 6,574,102 | B2 * | 6/2003 | Usui et al. | 361/687 |
| 6,587,335 | B1 * | 7/2003 | Nelson et al. | 361/687 |
| 6,618,248 | B1 * | 9/2003 | Dalheimer | 361/687 |
| 6,700,779 | B2 * | 3/2004 | Hanson et al. | 361/695 |
| 6,907,206 | B2 * | 6/2005 | Hattori et al. | 399/90 |
| 6,909,864 | B2 * | 6/2005 | Komatsubara | 399/92 |
| 6,975,814 | B2 * | 12/2005 | Tsusaka et al. | 399/6 |
| 7,218,517 | B2 * | 5/2007 | Wolford et al. | 361/695 |
| 7,248,471 | B2 * | 7/2007 | Wabiszczewicz | 361/694 |
| 2004/0062564 | A1 * | 4/2004 | Chikano | 399/92 |
| 2004/0096229 | A1 * | 5/2004 | Yoshihara et al. | 399/33 |
| 2005/0264993 | A1 * | 12/2005 | Marumoto | 361/690 |

FOREIGN PATENT DOCUMENTS

JP 2004093708 3/2004

* cited by examiner

*Primary Examiner*—Jayprakash N Gandhi
*Assistant Examiner*—Courtney Smith
(74) *Attorney, Agent, or Firm*—Ditthavong Mori & Steiner, P.C.

(57) ABSTRACT

In a cooling device of an image forming apparatus, a space is formed between a flat surface of a sheet metal attached on a circuit board attached part and a power source circuit board. A duct is formed by a shielding member formed in a U shape surrounding the space, and on the lower part of the flat surface of the sheet metal, a tubular part as an air outlet is formed so as to be elongated to the side of a main body. On the upper part of the sheet metal arranged in a vertical direction, a fan motor is mounted, which sends cooled air into the power source circuit board and the duct. The cooled air cools the power source circuit board and also cools a power source unit in the main body via the tubular member.

16 Claims, 3 Drawing Sheets

COOLING DEVICE FOR IMAGE FORMING APPARATUS

BACKGROUND OF THE INVENTION

1. Field of the Invention

The present invention relates to a cooling device of an image forming apparatus, and in particular, to a structure of a steel case to be used for cooling a power source unit, a power source circuit board and the like by sending air by a fan motor.

2. Description of the Related Art

An image forming apparatus such as a Multi Functional Printer forms an image by forming an electrostatic latent image on a photo conductor, transforming an image developed by a developer such as toner on a recording medium, and fixing the image by heating with a fixing device or the like. In addition, in order to supply a low voltage power and a high voltage power to each device for forming an image, a power source unit, a low voltage power source circuit board, and a high voltage power source circuit board are incorporated in the image forming apparatus. The power source unit generates heat when it supplies a power and each power source circuit board generates heat because a power transistor, other heat generation parts and the like are mounted on it. As an internal cooling device to discharge heat to the outside of the apparatus, a fan motor is generally used.

In recent days, miniaturization is required for the image forming apparatus and further, in order to achieve silence, reduction of a noise from a fan motor is also required for the image forming apparatus. In order to reduce the noise from the fan motor, it is necessary to reduce the rotation number of the fan motor or the number of fan motors themselves, however, the cooling efficiency is lowered in any case.

In Japanese Patent Laid-Open application No. 2004-93708, an image forming apparatus is disclosed, wherein cooling efficiency is increased by arranging an engine circuit board, a high voltage power source circuit board, and a low voltage power source circuit board along an inlet path of air induced by the fan motor.

In addition, as shown in FIG. 6, in order to send air efficiently, it is considered to place a duct. FIG. 6 shows a condition that an image forming apparatus is seen from its side. With reference to FIG. 6, an operation part 2 that is operated by a user is provided at a front side of a main body 1, and a reading part 3 for reading an image of an original is located above the main body 1. In the main body 1, a power source unit 4 as a heating source is incorporated.

In addition, as shown in FIG. 6, in order to send air efficiently, it is

At a rear side of the main body 1, a control part 5 is provided. Here, the control part 5 is represented by a dashed line and the interior portion of the control part 5 is shown by an outlined sectional view. In the control part 5, a sheet metal 6 is provided, and on this sheet metal 6, a power source circuit board 8 is attached. On the sheet metal 6, a duct 7 is formed, and the front end of this duct 7 is elongated and positioned at the vicinity of the power source unit 4 of the main body 1. At the further rear surface of the further upper part from the power source circuit board 8, a fan motor 9 is mounted. The cooled air is blown on the power source circuit board 8 by the fan motor 9 and the cooled air is sent to the power source unit 4 via the duct 7. As a result, it is not necessary to mount the fan motor specifically for the power source unit 4 and silence can be achieved by executing cooling of the power source circuit board 8 and cooling of the power source unit 4 by one fan motor 9.

In the example shown in FIG. 6, the shape of the duct 7 becomes complicated, so that the manufacturing cost of the sheet metal 6 is made higher and a problem, for example, the limitation such as a size of the inside of the device or the like may occur when the duct 7 is arranged.

SUMMARY OF THE INVENTION

Accordingly, the object of the present invention is to provide a cooling device of an image forming apparatus, which can achieve reduction of a cost and silence by making a structure thereof simple without arranging a duct for cooling separately.

A cooling device of an image forming apparatus of the present invention comprises a main body and a circuit board attached part which is attached to the main body and to which a circuit board is attached; a space is formed between the circuit board attached part and the circuit board and the space is used as a duct for cooling; and further, the cooling device comprises a cooler for sending cooled air to the circuit board and the duct.

According to the present invention, since a space is formed between a circuit board attached part and a circuit board, this space is used as a duct for cooling, and cooled air is sent to the circuit board and the duct by one cooling device, so that other heating parts can be cooled via the duct. Thereby, the number of cooling device can be decreased, so that silence can be achieved. Further, since the duct to send air can be configured by the circuit board and the circuit board attached part, the structure of the cooling device is not complicated thereby to reduce the cost.

Preferably, a heating part is incorporated in the main body and the heating part is cooled by the cooled air sent through the duct.

Specifically, an outlet through which the cooled air is sent is formed on the circuit board attached part and an inlet through which the cooled air sent from the outlet is introduced is formed in the vicinity of the heating part of the main body.

Further, the cooling device of the image forming apparatus may further include a shielding member, which is provided between the circuit board attached part and the circuit board to form a wall of the duct.

According to a preferable embodiment, the circuit board is attached on the circuit board attached part so that its pattern surface faces a flat surface of a sheet metal, however, according to other embodiment, the circuit board is attached on the circuit board attached part so that its part attached surface faces the flat surface of the sheet metal.

DETAILED DESCRIPTION OF THE INVENTION

Figure 1:
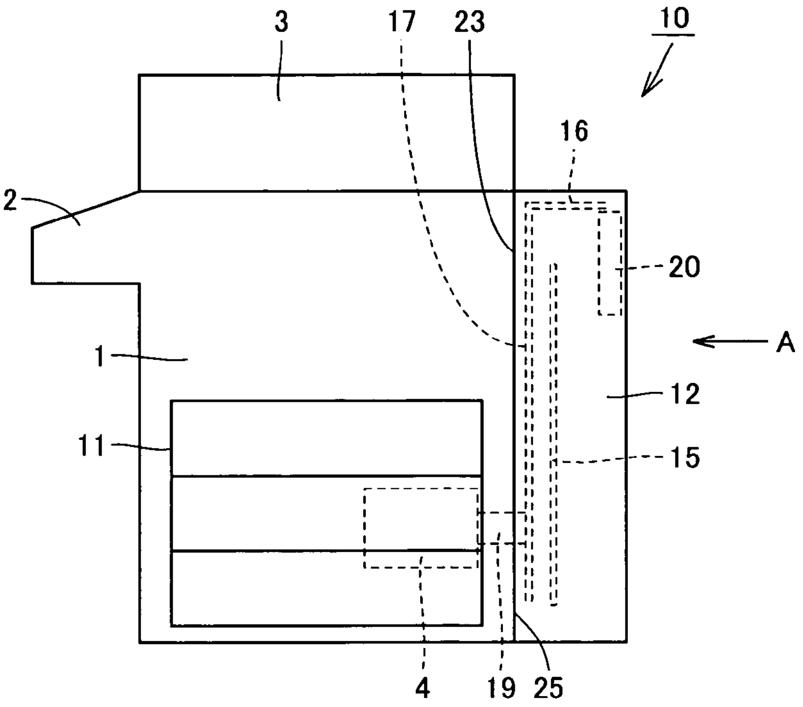
FIG. 1 is a side view showing an example of an image forming apparatus to which the present invention is applied.
Figure 2:
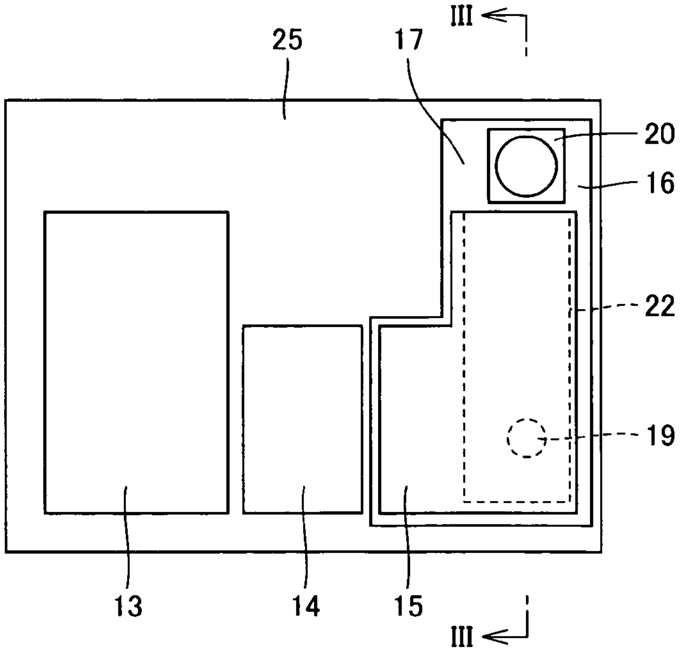
FIG. 2 is an arrangement plan of a circuit board that is arranged in a control part.
Figure 3:
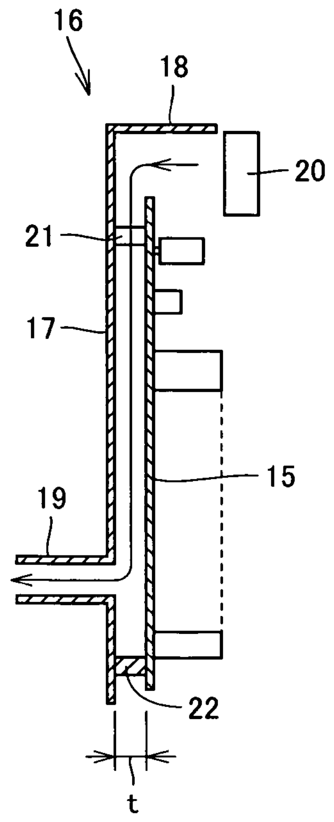
FIG. 3 is a sectional view showing the arrangement of a power source circuit board of the control part.
Figure 4:
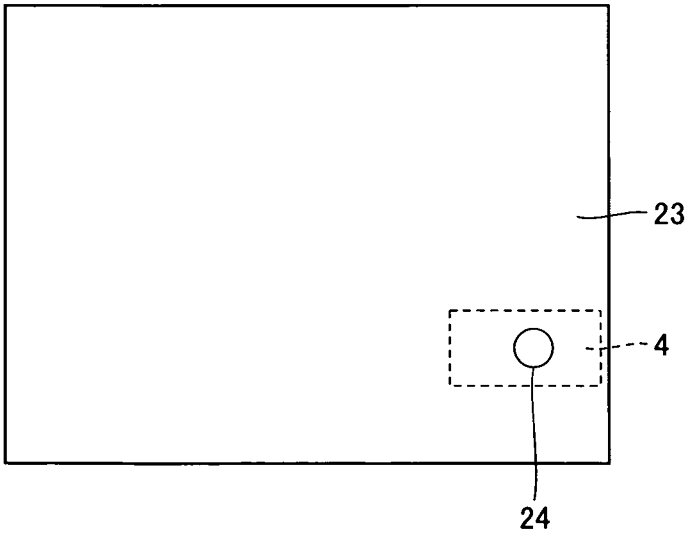
FIG. 4 is a view showing a rear side of a main body.

FIG. 1 is a side view showing an example of an image forming apparatus to which the present invention is applied, FIG. 2 is an arrangement of a circuit board that is arranged in a control part, which is seen from an arrow A shown in FIG. 1, FIG. 3 is a sectional view seen along a line III-III in FIG. 2, and FIG. 4 shows a rear side of a main body 1 seen from an arrow A in FIG. 1.

Figure 6:
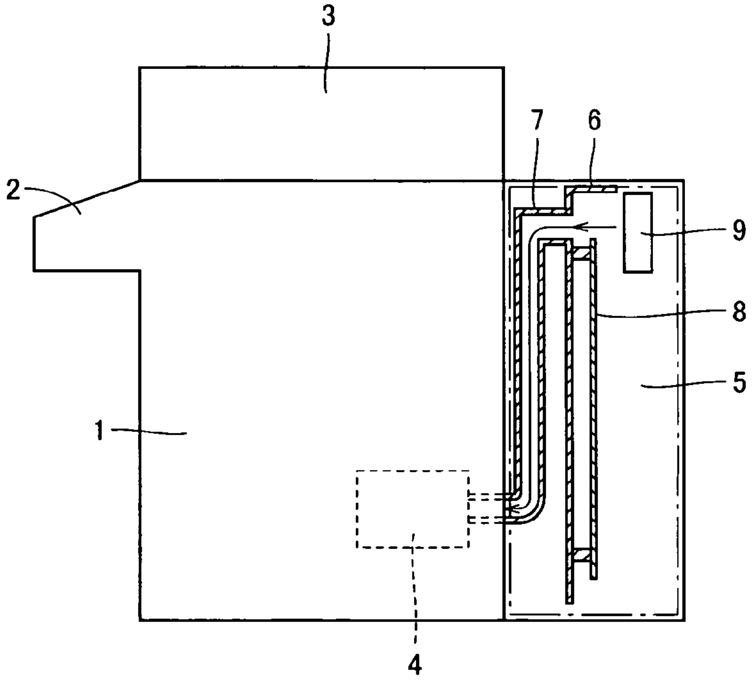
FIG.6 PRIOR ART
FIG. 6 is a side view of a conventional image forming apparatus.

In FIG. 1, similar to FIG. 6, an image forming apparatus 10 includes the main body 1, an operation part 2, and a reading part 3, and it incorporates a power source unit 4 as a heating part therein. On the side of the main body 1, a plurality of paper feeding cassettes 11 are arranged in accordance with a size of each paper and a power source unit 4 is located at a back side seen from the side.

At a back side of a rear surface 23 of the main body 1, a circuit board attached part 25 is formed, and the rear surface of the circuit board attached part 25 composes a control part 12. As shown in FIG. 2, on the circuit board attached part 25, a printer circuit board 13, an engine control circuit board 14 to control a printer engine, and a power source circuit board 15 are set. On a portion of the circuit board attached part 25, a sheet metal 16 is provided, and the power source circuit board 15 is attached so that a pattern surface that is a rear side of a part attached surface faces a flat surface 17 of the sheet metal 16.

A space is formed between sheet metal 16 and the power source circuit board 15 by attaching the power source circuit board 15 to face the sheet metal 16 with a certain distance t (FIG. 3). In addition, as shown in FIG. 3, on the sheet metal 16, a side wall 18 is formed so as to encircle the circumference of the sheet metal 16 except for the lower part of the flat surface 17 shaped in an inverse L, and at the lower part of the flat surface 17 of the sheet metal 16, a tubular part 19 that is an air outlet is formed so as to access the main body 1. The air outlet may be just a hole. On the flat surface 17 of the sheet metal 16, a plurality of support members 21 are arranged and by these plural support members 21, the power source circuit board 15 is attached on the flat surface 17 of the sheet metal 16.

In order to cover the circumference of the sheet metal 16 except for the upper part of the space between the power source circuit board 15 and the flat surface 17 of the sheet metal 16, a shielding member 22 formed in a U shape seen from the rear side shown in FIG. 2 is attached on either of the power source circuit board 15 and the flat surface 17. Thereby, a space between the flat surface 17 of the sheet metal 16 and the power source circuit board 15 forms a duct. A fan motor 20 is provided at the upper portion of the sheet metal 16 arranged in a vertical direction, a. The fan motor 20 sends cooled air to the power source circuit board 15 and the above-mentioned duct. In the meantime, the fan motor 20 may be attached on a hole formed on the power source circuit board 15.

As shown in FIG. 4, on the rear surface 23 of the main body 1, a hole 24 is formed in the vicinity of the power source unit 4 as an inlet. In the hole 24, the tubular part 19 shown in FIG. 3 is inserted. In the image forming apparatus 10 that is configured in this way, the fan motor 20 sends air from the outside into the power source circuit board 15; the space surrounded by the power source circuit board 15, the flat surface 17 of the sheet metal 16 and the side wall 18; and the power source unit 4 through the tubular part 19 via the hole 24 so as to cool the power source circuit board 15 and the power source unit 4.

In the meantime, by forming notched portions on the side wall 18, the printer circuit board 13 in the control part 12 and the electronic parts mounted on the engine control circuit board 14 may be cooled together.

As described above, according to the present embodiment, the space encircled by the power source circuit board 15 and the flat surface 17 of the sheet metal 16 can be functioned as a duct, so that there is no need to provide the dedicated duct for sending cooled air, the printer circuit board 13 in the control part 12, the engine control circuit board 14, and the power source circuit board 15 can be cooled by one fan motor 20, and also, the power source unit 4 in the main body 1 can be cooled. Thereby, the structure of the steel case can be simplified. Further, since there is no need to cool the control part 12 and the power source unit 4 by separate fan motors, the number of fan motor can be reduced and silence can be achieved.

Figure 5:
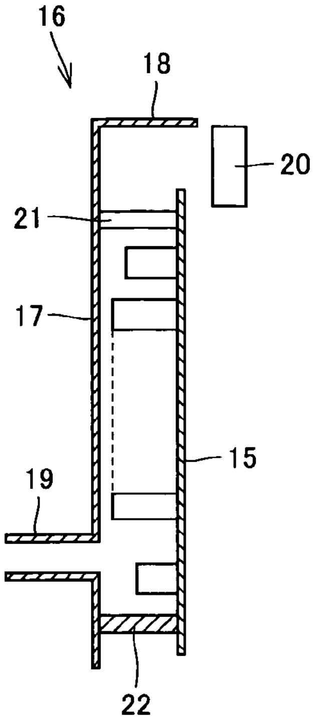
FIG. 5 is a sectional view showing other embodiment of the present invention.

FIG. 5 is a sectional view showing another embodiment of the present invention. According to this embodiment, the part attached surface of the power source circuit board 15 is arranged so as to face the flat surface 17 of the sheet metal 16, and others are the same as FIG. 3.

According to this embodiment, since the electronic parts of the power source circuit board 15 are arranged in the duct, it is possible to enhance the cooling effect of these electronic parts.

In the meantime, in FIG. 3 and FIG. 5, if a noise countermeasure material is used as the shielding member 22, the inlet of air can be secured while improving an anti-noise capability.

In addition, in the above-described embodiments, the tubular member 19 for sending air is attached on the flat surface 17 of the sheet metal 16. However, the present invention is not limited to this and without providing the shielding member 22, an opening at the lower side is made into an air outlet and a heating source may be attached in the vicinity of this air outlet.

In the above embodiment, the motor fan is used as a cooler to send cooled air. However, other equipments can be used as a cooler.

The embodiments of the present invention are described above with reference to the drawings, however, the present invention is not limited to the illustrated embodiments. It is possible to add various modifications and variations to the illustrated embodiments within the same range or the equivalent range as that of the present invention.

What is claimed is:

1. A cooling device of an image forming apparatus, said cooling device comprising:

a main body configured to house a heating part therein, a back side of said main body having an attachment part to which a circuit board is attached;

a duct that includes a space provided between said attachment part and said circuit board; and a cooler configured to send air through said duct to cool said circuit board, wherein said duct and said cooler are configured to send air to the heating part to cool the heating part, wherein a hole is provided through said attachment part, said hole being connected to said duct, and wherein a tubular part is provided that extends from said hole to a location adjacent the heating part.

2. A cooling device of an image forming apparatus, said cooling device comprising:

a main body configured to house a heating part therein, a back side of said main body having an attachment part to which a circuit board is attached;

a duct that includes a space provided between said attachment part and said circuit board;

a cooler configured to send air through said duct to cool said circuit board; and a shielding member having a first side attached to said attachment part and a second side attached to the circuit board, wherein said shielding member is configured to extend from said attachment part to the circuit board to form a wall of said duct, wherein a hole is provided through said attachment part, said hole being connected to said duct and configured to send air to the main body.

3. The cooling device according to claim 1, wherein the circuit board is attached on said attachment part so that a pattern surface of the circuit board faces away from an interior of said duct.

4. The cooling device according to claim 1, wherein the circuit board is attached on said attachment part so that a pattern surface of the circuit board faces away from an interior of said duct.

5. An image forming apparatus comprising:

a cooler;

a main body configured to house a heating part therein;

a sheet member attached to said main body;

a circuit board attached to said sheet member, wherein a duct is provided that includes a space that is formed between said sheet member and said circuit board, said duct having at least one bend configured to channel air from said cooler to an inner region of said main body; and a heating part provided within said main body, wherein said duct and said cooler are configured to send air to said heating part to cool said heating part, wherein a hole is provided through said sheet member, said hole being connected to said duct, and wherein a tubular part is provided that extends from said hole to a location adjacent said heating part.

6. An image forming apparatus comprising:

a cooler;

a main body configured to house a heating part therein;

a sheet member attached to said main body;

a circuit board attached to said sheet member, wherein a duct is provided that includes a space that is formed between said sheet member and said circuit board, said duct having at least one bend configured to channel air from said cooler to an inner region of said main body; and a shielding member having a first side attached to said sheet member and a second side attached to said circuit board, wherein said shielding member extends from said sheet member to said circuit board to form a wall of said duct.

7. The image forming apparatus according to claim 5, wherein said circuit board is attached on said sheet member so that a pattern surface of said circuit board faces towards an interior of said duct.

8. The image forming apparatus according to claim 5, wherein said circuit board is attached on said sheet member so that a pattern surface of said circuit board faces away from an interior of said duct.

9. A cooling device of an image forming apparatus, said cooling device comprising:

a main body defining a housing configured to enclose a heating part therein;

an attachment part provided on an outer side surface of said main body, said attachment part being outside of said housing, said attachment part being configured to have a circuit board attached thereto outside of said housing, said attachment part being configured to receive the circuit board such that a duct is defined as a space between said attachment part and the circuit board; and a cooler configured to send air through said duct to cool the circuit board, wherein a hole is provided through said attachment part, said hole being connected to said duct and configured to send air to the main body.

10. A cooling device of an image forming apparatus, said cooling device comprising:

a main body defining a housing configured to house a heating part therein;

an attachment part provided on a side of said main body and outside of said housing, and attachment part being configured to have a circuit board attached thereto, said attachment part being configured to receive the circuit board such that a duct is defined as a space between said attachment part and the circuit board;

a cooler configured to send air through said duct to cool the circuit board; and a tubular part that extends from a hole in said attachment part that is connected to said duct to a location adjacent the heating part, wherein said cooler is configured to send air through said tubular part to cool the heating part.

11. A cooling device of an image forming apparatus, said cooling device comprising:

a main body defining a housing configured to house a heating part therein;

an attachment part provided on a side of said main body and outside of said housing, said attachment part being configured to have a circuit board attached thereto, said attachment part being configured to receive the circuit board such that a duct is defined as a space between said attachment part and the circuit board;

a cooler configured to send air through said duct to cool the circuit board; and a shielding member having a first side attached to said attachment part and a second side attached to the circuit board, wherein said shielding member is configured to extend from said attachment part to the circuit board to form a wall of said duct, wherein a hole is provided through said attachment part, said hole being connected to said duct and configured to send air to the main body.

12. The cooling device according to claim 9, wherein said attachment part is configured to receive the circuit board so that a pattern surface of the circuit board faces towards an interior of said duct.

13. The cooling device according to claim 9, wherein said attachment part is configured to receive the circuit board so that a pattern surface of the circuit board faces away from an interior of said duct.

14. The cooling device according to claim 9, wherein said attachment part is formed of sheet metal.

15. The cooling device according to claim 1, wherein said attachment part is formed of sheet metal.

16. The image forming apparatus according to claim 5, wherein said sheet member is formed of sheet metal.

* * * * *